United States Patent
Campbell et al.

(10) Patent No.: US 7,462,941 B2
(45) Date of Patent: Dec. 9, 2008

(54) POWER GRID LAYOUT TECHNIQUES ON INTEGRATED CIRCUITS

(75) Inventors: John Campbell, Santa Clara, CA (US); Kim R. Stevens, Santa Clara, CA (US); Luigi DiGregorio, Santa Clara, CA (US)

(73) Assignee: Telairity Semiconductor, Inc., Santa Clara, CA (US)

( * ) Notice: Subject to any disclaimer, the term of this patent is extended or adjusted under 35 U.S.C. 154(b) by 0 days.

(21) Appl. No.: 11/237,304

(22) Filed: Sep. 27, 2005

(65) Prior Publication Data

US 2006/0081984 A1   Apr. 20, 2006

Related U.S. Application Data

(63) Continuation-in-part of application No. 10/631,471, filed on Jul. 30, 2003, now Pat. No. 6,998,719.

(51) Int. Cl.
   *H01L 23/52* (2006.01)
   *H01L 23/48* (2006.01)
   *H01L 29/40* (2006.01)

(52) U.S. Cl. .................. 257/781; 257/E23.02; 257/738; 257/780; 257/784; 257/786; 438/612; 174/255; 174/262

(58) Field of Classification Search .................. 257/738, 257/780, E23.021, E23.069, E23.153, 691, 257/698, E23.02, 781, 778, 774, 775, 786; 174/255, 262; 438/612

See application file for complete search history.

(56) References Cited

U.S. PATENT DOCUMENTS

| | | | |
|---|---|---|---|
| 5,498,901 A | | 3/1996 | Chillara et al. |
| 5,646,548 A | | 7/1997 | Yao et al. |
| 5,723,908 A | * | 3/1998 | Fuchida et al. ............... 257/758 |
| 5,739,045 A | * | 4/1998 | Cronin et al. ............... 438/396 |
| 5,982,632 A | * | 11/1999 | Mosley et al. ............... 361/775 |
| 6,086,386 A | * | 7/2000 | Fjelstad et al. ............... 439/70 |
| 6,153,829 A | | 11/2000 | Carapella et al. |
| 6,305,000 B1 | * | 10/2001 | Phan et al. ..................... 716/5 |
| 6,437,431 B1 | * | 8/2002 | Mbouombouo et al. ..... 257/676 |
| 6,536,028 B1 | * | 3/2003 | Katsioulas et al. ............ 716/17 |
| 6,627,999 B2 | * | 9/2003 | Akram et al. ............... 257/778 |

(Continued)

OTHER PUBLICATIONS

Cataldo "Cadence ratchets up diagonal interconnect effort," EE Times UK (Oct. 2002).

(Continued)

*Primary Examiner*—Kenneth Parker
*Assistant Examiner*—Chris C. Chu
(74) *Attorney, Agent, or Firm*—Townsend and Townsend and Crew LLP

(57) ABSTRACT

Techniques are provided for reducing the power supply voltage drop introduced by routing conductive traces on an integrated circuit. Techniques for reducing variations in the power supply voltages received in different regions of an integrated circuit are also provided. Power supply voltages are routed within an integrated circuit across conductive traces. The conductive traces are coupled to solder bumps that receive power supply voltages from an external source. Alternate ones of the traces receive a high power supply voltage $V_{DD}$ and a low power supply voltage $V_{SS}$. The conductive traces reduce the voltage drop in the power supply voltages by providing shorter paths to route the power supply voltages to circuit elements on the integrated circuit.

9 Claims, 5 Drawing Sheets

U.S. PATENT DOCUMENTS

| | | | | |
|---|---|---|---|---|
| 6,680,544 B2 * | 1/2004 | Lu et al. | .................... | 257/786 |
| 6,815,812 B2 * | 11/2004 | Ali et al. | .................... | 257/691 |
| 6,891,248 B2 * | 5/2005 | Akram et al. | ............... | 257/532 |
| 6,897,561 B2 * | 5/2005 | Nemtsev et al. | ............ | 257/758 |
| 6,951,811 B2 * | 10/2005 | Sorimachi | ................... | 438/637 |
| 6,998,719 B2 * | 2/2006 | Campbell et al. | ........... | 257/786 |
| 7,086,024 B2 * | 8/2006 | Hsu et al. | ..................... | 716/8 |
| 2004/0119154 A1 * | 6/2004 | Briere | ....................... | 257/692 |

OTHER PUBLICATIONS

Glover"DAC Report 2003, Renewed Optimism in EDA," EDA Today, L.C. (Aug. 2003).

Goering"ReShape CTO: Time to dump power rings," EE Design (Mar. 2003).

Lipman"X Marks the Spot of New Chip Architecture," TechOnLine (Jun. 13, 2001).

"Nikon joins group to validate diagonal IC design," Silicon Strategies EE Design Online (Dec. 2002).

\* cited by examiner

POWER GRID LAYOUT TECHNIQUES ON INTEGRATED CIRCUITS

CROSS REFERENCE TO A RELATED PATENT APPLICATION

This application is a continuation-in-part of U.S. patent application Ser. No. 10/631,471, filed Jul. 30, 2003, which is incorporated by reference herein.

BACKGROUND OF THE INVENTION

The present invention relates to techniques for forming power grids on integrated circuits, and more particularly, to techniques for routing supply voltage traces on integrated circuits that have a low voltage drop.

Power supply voltages are typically supplied to an integrated circuit from an external power supply source. Typically ring structures at the edges of the integrated circuit form the backbone of the power distribution system. The metal traces extend from the ring structures to the center of the integrated circuit in a serpentine fashion. The metal traces are then coupled to transistors in other layers of the integrated circuit. The traces used to route supply voltages to transistors at the center of an integrated circuit are substantially longer than the traces used to route the supply voltages to transistors near the edge of the integrated circuit.

The metal traces used to route power supply voltages into an integrated circuit have resistance. Because longer metal traces are used to route supply voltages to transistors that are farther away from the edges of the integrated circuit, transistors at the center of the integrated circuit receive a reduced supply voltage ($V_{DD}$-$V_{SS}$) relative to the supply voltage received by transistors near an edge of the integrated circuit. The magnitude of the voltage drop depends on the amount of current demanded as well as the size and the resistance of the conductors.

The speed of transistors is dependent in part on the magnitude of the power supply voltages they receive. Devices at the center of an integrated circuit may operate at reduced speeds, because they receive a reduced supply voltage. This can cause timing problems such as clock skew or increased propagation delay of gates and flip-flops. In larger integrated circuits, the reduction in the supply voltage can be even larger at the center of the chip.

Therefore, it would be desirable to provide techniques for routing power supply voltages within an integrated circuit that reduces voltage drop in the routing traces. It would also be desirable to provide techniques for routing power supply voltages within an integrated circuit that reduces the variations in the power supply voltages received in different regions of the integrated circuit.

BRIEF SUMMARY OF THE INVENTION

The present invention provides techniques for reducing voltage drops in power supply traces on an integrated circuit. The present invention also provides techniques for reducing variations in the power supply voltages received in different regions of an integrated circuit.

According to the present invention, power supply voltages are routed through traces in a conducting layer of an integrated circuit. The power supply voltages are provided to the traces from external voltage sources through solder bumps. Circuit elements in other layers of the integrated circuit are coupled to the traces to receive the power supply voltages.

A first set of traces in the conducting layer receives a high power supply voltage $V_{DD}$. A second set of traces in the conducting layer receives a low power supply voltage $V_{SS}$ (e.g., ground). The first and second sets of traces can be parallel traces that are routed from one edge of the integrated circuit to another edge. The $V_{DD}$ and $V_{SS}$ traces are interleaved together.

Power supply traces of the present invention provide more direct and more uniform paths to route power supply voltages to circuit elements on an integrated circuit. Additional cross grids of underlying metal layers can be provided to strengthen the power supply traces.

Other objects, features, and advantages of the present invention will become apparent upon consideration of the following detailed description and the accompanying drawings, in which like reference designations represent like features throughout the figures.

DETAILED DESCRIPTION OF THE INVENTION

Figure 1A:
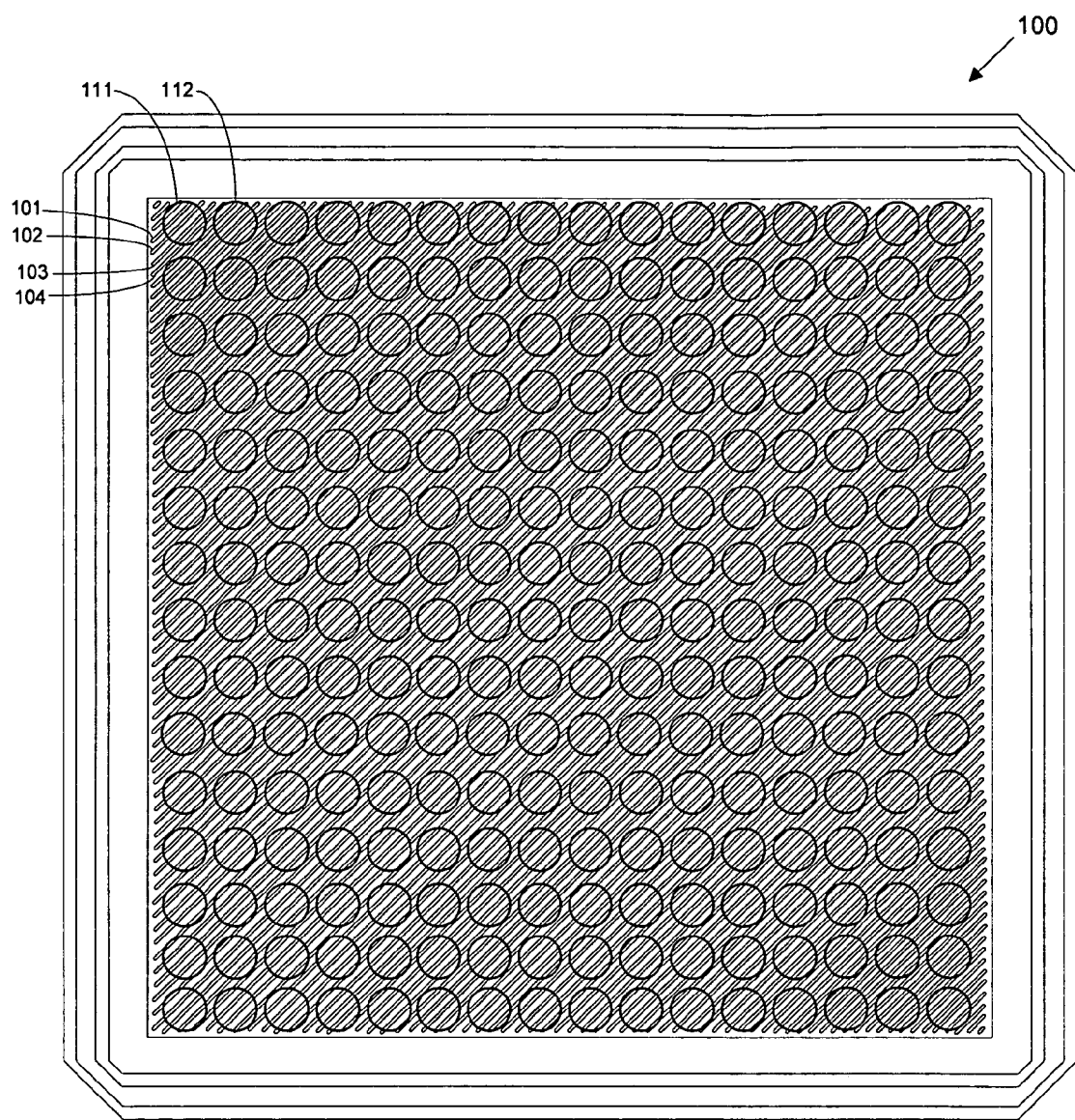
FIG. 1A illustrates a diagram of a power grid with diagonal power supply traces and solder bumps according to an embodiment of the present invention.

FIG. 1A illustrates a first embodiment of the present invention. Integrated circuit 100 includes a plurality of conductive traces such as traces 101-102. The conductive traces are formed in a conductive layer of integrated circuit 100. The conductive traces are aligned diagonally with respect to an edge of circuit 100 as shown in FIG. 1A. According to one embodiment of the present invention, the conductive traces are routed at 45 degree angles with respect to the edges of circuit 100. As another example, the conductive traces are routed at an angle between 35 and 55 degrees with respect to an edge of circuit 100.

Half of the conductive diagonal traces (such as traces 101 and 103) are powered by power supply $V_{DD}$. These traces are referred to as the $V_{DD}$ traces. The other half of the conductive diagonal traces (such as traces 102 and 104) are powered by power supply $V_{SS}$ (e.g., ground). These traces are referred to as the $V_{SS}$ traces. The $V_{DD}$ traces are interleaved between the $V_{SS}$ traces. Thus, each $V_{DD}$ trace is located in between two $V_{SS}$ traces, and each $V_{SS}$ trace is located in between two $V_{DD}$ traces, except the trace in the upper left and the trace in the lower right of circuit 100. Circuit 100 has a power grid including conductive traces that are alternately coupled to $V_{DD}$ and to $V_{SS}$ in a comb structure. The comb structure allows the $V_{DD}$ and $V_{SS}$ traces to be closely spaced to allow more connections from the $V_{DD}$ and $V_{SS}$ traces to the underlying layers of integrated circuit 100.

The diagonal traces are parallel to each other. The diagonal traces can be, for example, several hundred microns in width down to the design rule limits of a particular process technology. As process technology advances, an additional advantage can be obtained by selecting a width for the traces that is at or near the design rule limits. For a given area, the amount of sidewall capacitance between $V_{DD}$ and $V_{SS}$ increases near the design rule limits and is effectively additional power supply bypass capacitance. This also increases the effective resistance of the $V_{DD}$ and $V_{SS}$ traces shown in FIG. 1A.

In the embodiment of FIG. 1A, the diagonal traces are slanted upwardly from the bottom left to the upper right corners of circuit 100. According to other embodiments of the present invention, the diagonal traces are slanted the other way, downwardly from top left to lower right corners of an integrated circuit.

Integrated circuit 100 includes a plurality of solder bumps such as solder bumps 111 and 112. Each solder bump is coupled to a power supply voltage source. For example, solder bump 111 is coupled to high power supply voltage source $V_{DD}$, and solder bump 112 is coupled to low power supply voltage source $V_{SS}$. 240 solder bumps are shown in FIG. 1A. However, the present invention includes integrated circuits with any number of solder bumps.

Figure 1B:
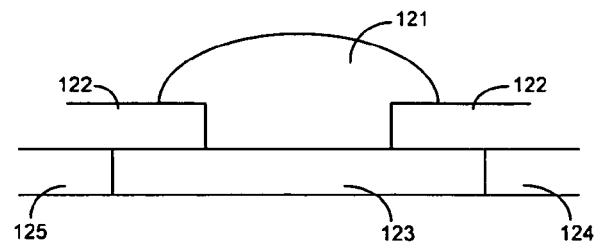
FIG. 1B illustrates a cross sectional diagram of a solder bump that is coupled to the power grid layout according to an embodiment of the present invention.

An example of a cross sectional view of one of the solder bumps is shown in FIG. 1B. As shown in FIG. 1B, solder bump 121 is formed within a hole in oxide layer 122. Solder bump 121 can be made of any suitable conductive material such as aluminum. Solder bump 121 contacts conductive pad 123 through the hole in oxide 122. Conductive fingers 124 and 125 extend out from pad 123 to provide additional surface area to couple to the power supply traces.

Figure 2:
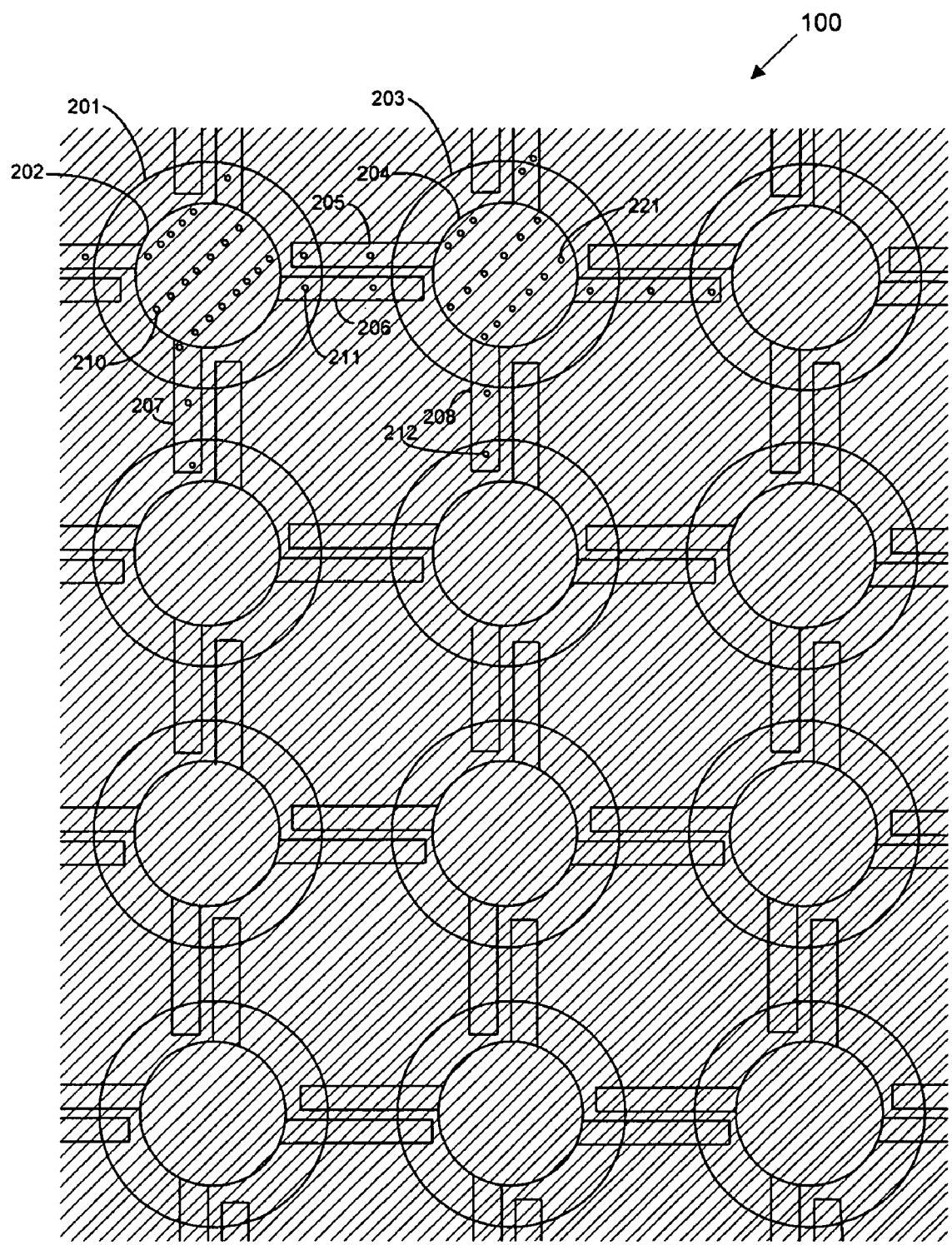
FIG. 2 illustrates a diagram of a diagonal power grid with conductive fingers extending in four directions from each of the solder bumps according to an embodiment of the present invention.

Each of the solder bumps is coupled to one or more of the power supply traces through vias. Solder bumps that receive the high power supply voltage are coupled to the $V_{DD}$ diagonal traces, and the solder bumps that receive the low power supply voltage are coupled to the $V_{SS}$ diagonal traces. FIG. 2 illustrates examples of connections between two of the solder bumps and the underlying $V_{DD}$ and $V_{SS}$ diagonal traces in circuit 100.

FIG. 2 illustrates 12 circular solder bumps. Each solder bump is formed in a hole in an underlying oxide layer as discussed above with respect to FIG. 1B. For example, solder bump 202 is formed in a hole in oxide 201, and solder bump 204 is formed in a hole in oxide 203. Solder bump 202 is coupled to the $V_{DD}$ diagonal traces through multiple vias including via 210. Solder bump 204 is coupled to the $V_{SS}$ diagonal traces through multiple vias including via 221.

Each of the solder bumps is also coupled to four conductive fingers extending out from the solder bump in four perpendicular directions, as shown in FIG. 2. For example, solder bump 202 is coupled to four conductive fingers including fingers 206 and 207, and solder bump 204 is coupled to four conductive fingers including fingers 205 and 208. The conductive fingers provide additional surface area for the solder bumps to connect to the underlying diagonal power supply traces. For example, conductive finger 206 is coupled to a $V_{DD}$ trace through via 211, and conductive finger 208 is coupled to a $V_{SS}$ trace through via 212.

The number of $V_{DD}$ and $V_{SS}$ traces, and solder bumps shown in FIG. 1A and the other figures are merely examples of the present invention that are used for illustrative purposes. Integrated circuits of the present invention can have any number of $V_{DD}$ and $V_{SS}$ traces and solder bumps.

Figure 3:
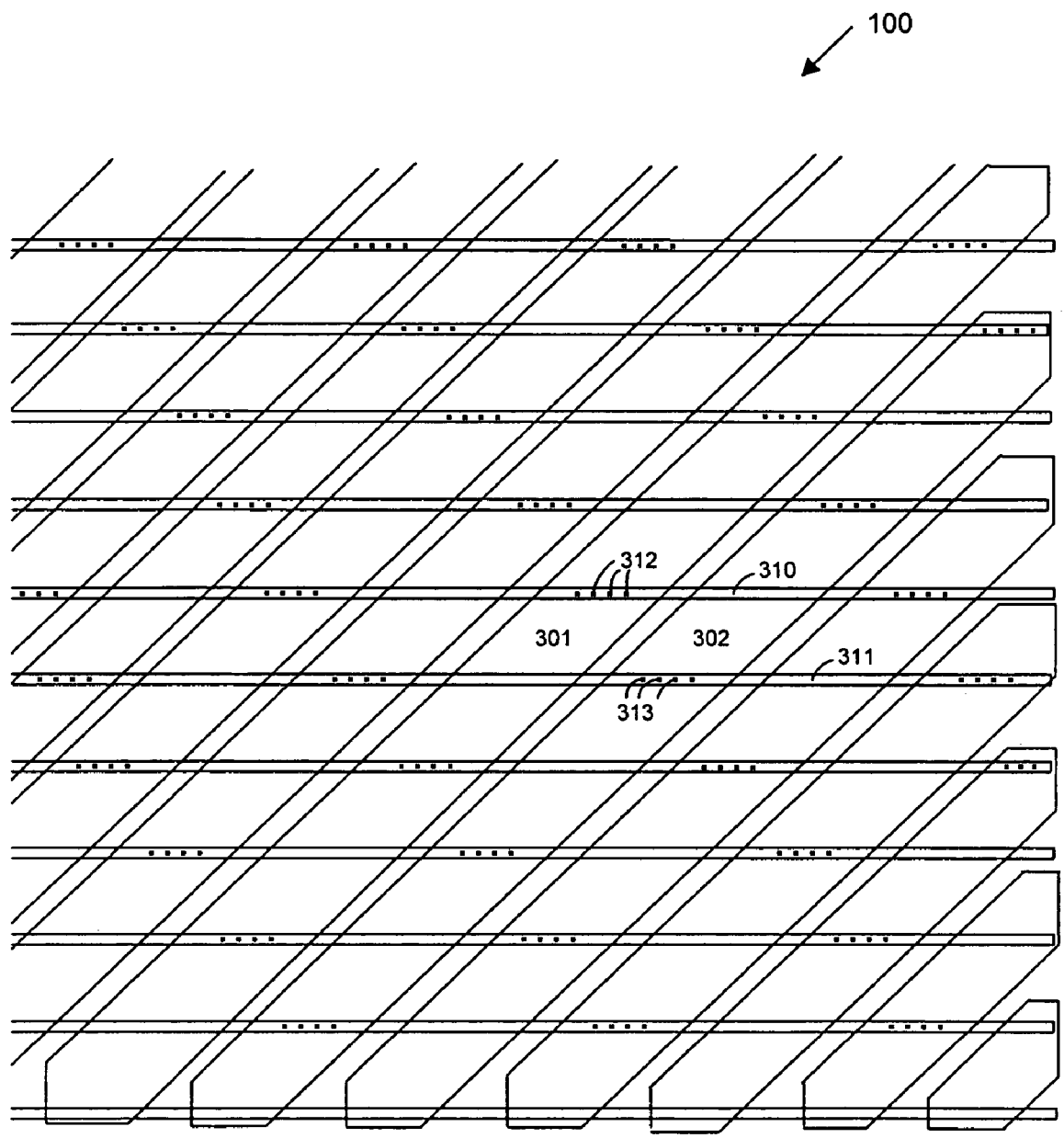
FIG. 3 illustrates a diagram of a diagonal power grid with horizontal conductors in a another layer according to an embodiment of the present invention.

According to another embodiment of the present invention, the $V_{DD}$ and $V_{SS}$ traces are connected to wires in another conductive layer of an integrated circuit, e.g., through vias. FIG. 3 illustrates an example of this embodiment of the present invention. FIG. 3 illustrates further details of integrated circuit 100. According to this embodiment, $V_{DD}$ and $V_{SS}$ traces are formed in one conductive layer of integrated circuit 100, and horizontal wires are formed in a second conductive layer of circuit 100.

Wires 310-311 are examples of horizontal wires in the second conductive layer. Wire 310 is coupled to $V_{DD}$ trace 301 through vias 312. Wire 310 is also coupled to other $V_{DD}$ traces on circuit 100 through other sets of vias as shown in FIG. 3. Wire 311 is coupled to $V_{SS}$ trace 302 through vias 313. Wire 311 is also coupled to other $V_{SS}$ traces on circuit 100 through other sets of vias as shown in FIG. 3.

A power pole begins at a third layer on integrated circuit 100. The third layer may be, for example, below the first and second layers. The power pole delivers the power supply voltages to additional layers in circuit 100. For example, the power pole can deliver the power supply voltages to transistors in lower layers of circuit 100.

Connections can be made from the $V_{DD}$ and $V_{SS}$ traces to underlying layers at regular intervals. For example, connections can be made from the $V_{DD}$ and $V_{SS}$ traces to underlying layers every 25-50 microns across chip 100. Alternatively, connections can be made at irregular intervals. The distance between intervals can vary depending upon the process technology and transistor dimensions. For example, connections can be made at smaller intervals in finer processes.

The design of numerous interleaved $V_{DD}$ and $V_{SS}$ traces across a power layer as shown in FIG. 1A allows the power supply voltages to be connected more directly to circuit elements in other layers of chip 100 (such as transistors). Because the $V_{DD}$ and $V_{SS}$ traces are interleaved together across the length of chip 100, circuit elements that lie anywhere on chip 100 are close to the nearest $V_{DD}$ and $V_{SS}$ traces.

Each circuit element in chip 100 is close to the nearest $V_{DD}$ connection via a $V_{DD}$ trace. Each circuit element in chip 100 is close to the nearest $V_{SS}$ connection via a $V_{SS}$ trace. For example, assume that the horizontal wires such as wires 310 and 311 in the second conductive layer are spaced a distance X microns apart from each other, and that the horizontal wires traverse the entire area of chip 100. Any circuit element on chip 100 is no more than X microns from a connection to $V_{DD}$ or $V_{SS}$ through one of the horizontal wires in the second conductive layer.

As another example, circuit elements in underlying layers of circuit 100 can connected directly to the diagonal $V_{DD}$ and $V_{SS}$ traces (e.g., traces 101-102 of FIG. 1A), without excessive routing through a second conductive layer. According to the present invention, the length of routes needed to connect a power supply source to a circuit element in chip 100 is reduced, because the power supply routes through the $V_{DD}$ and $V_{SS}$ traces are shorter and more direct than prior art power supply routing techniques.

Prior art techniques used longer wires routed in irregular patterns to transmit power supply voltages to the circuit elements. The wires that brought power supplies to circuit elements at the center of a chip are especially long and resistive in prior art systems. The present invention reduces the length of wire between the power supply source and the endpoint circuit elements that receive the power supply.

In general, the total resistance in a conductor increases proportionally with the length of the conductor. Because the length of the conductors used to route power supply voltages is reduced in the present invention, these conductors cause less of a voltage drop in the power supply voltages $V_{DD}$ and $V_{SS}$. By reducing voltage drops in the power supply that are caused by the resistance of routing wires, circuit elements in chip 100 can operate at a faster and more uniform speed.

The techniques of the present invention also provide consistency in terms of circuit elements located in different areas of chip 100. In prior art systems, there can be large variations in the length of wires that connect the supply voltages to different parts of the chip. As a result, supply voltages have different voltage drops in different portions of a chip. Transistors that receive a greater supply voltage operate faster than transistors that receive a smaller supply voltage.

According to the present invention, supply voltages provided to different portions of chip 100 have a more uniform voltage drop, because the solder bumps and power supply traces are distributed uniformly throughout the surface area of the chip. By providing alternating traces coupled to $V_{DD}$ and $V_{SS}$, each circuit element is relatively close to a power supply connection. This design provides more uniform power supply voltages across the chip.

As a result, variations in the speed of circuit elements in different areas of chip 100 are reduced. Reducing variations in the speed of circuit elements is especially important for clock buffers in circuit designs that require balanced clock trees as an important part of the circuit design.

The present invention also increases the power supply voltage differential between $V_{DD}$ and $V_{SS}$ received by circuit elements on chip 100. The $V_{DD}$ traces of the present invention cause less of a voltage drop in $V_{DD}$, and the $V_{SS}$ traces of the present invention cause less of a voltage drop in $V_{SS}$. The result is that the total supply voltage $V_{DD}$-$V_{SS}$ is greater.

For example, $V_{DD}$ and $V_{SS}$ traces of the present invention can add less than 10 mV of voltage drop into $V_{DD}$ or $V_{SS}$. In this example, the total voltage drop from $V_{DD}$ to $V_{SS}$ is reduced to less than 20 mV from its ideal value due to resistance in the interconnecting wires. As a more specific example, a 3 volt ideal value for $V_{DD}$ is reduced to 2.99 volts by the connecting wires, and a 0 volt ideal value for $V_{SS}$ is increased to 0.01 volts by the connecting wires, for a total supply voltage drop of 2.98 volts.

The connecting wires in many prior art chips add more than 200 mV of voltage into $V_{DD}$ and $V_{SS}$. 200 mV represents 11% of a 1.8 volt upper supply voltage $V_{DD}$. 200 mV represents 20% of a 1.0 volt upper supply voltage $V_{DD}$. Thus, as supply voltages are reduced, the voltage drop added by the connecting wires represents an increasingly significant portion of the total supply voltage. The present invention provides a cost efficient solution for reducing the voltage drops that are added by connecting wires to the supply voltage.

By reducing the supply voltage drop caused by connecting wires, circuit elements in a chip have improved performance characteristics. For example, transistors can operate faster with a larger voltage differential between $V_{DD}$ and $V_{SS}$. In addition, computer aided design (CAD) tools can more accurately predict the performance of circuit elements when the supply voltage drops caused by connecting wires are reduced.

The embodiment of FIG. 1A also has improved characteristics regarding driving large bus structures, because the power rails do not collapse while driving many parallel long wires from a set of 16/32/64/128 buffers driving from approximately the same location.

Figure 4:
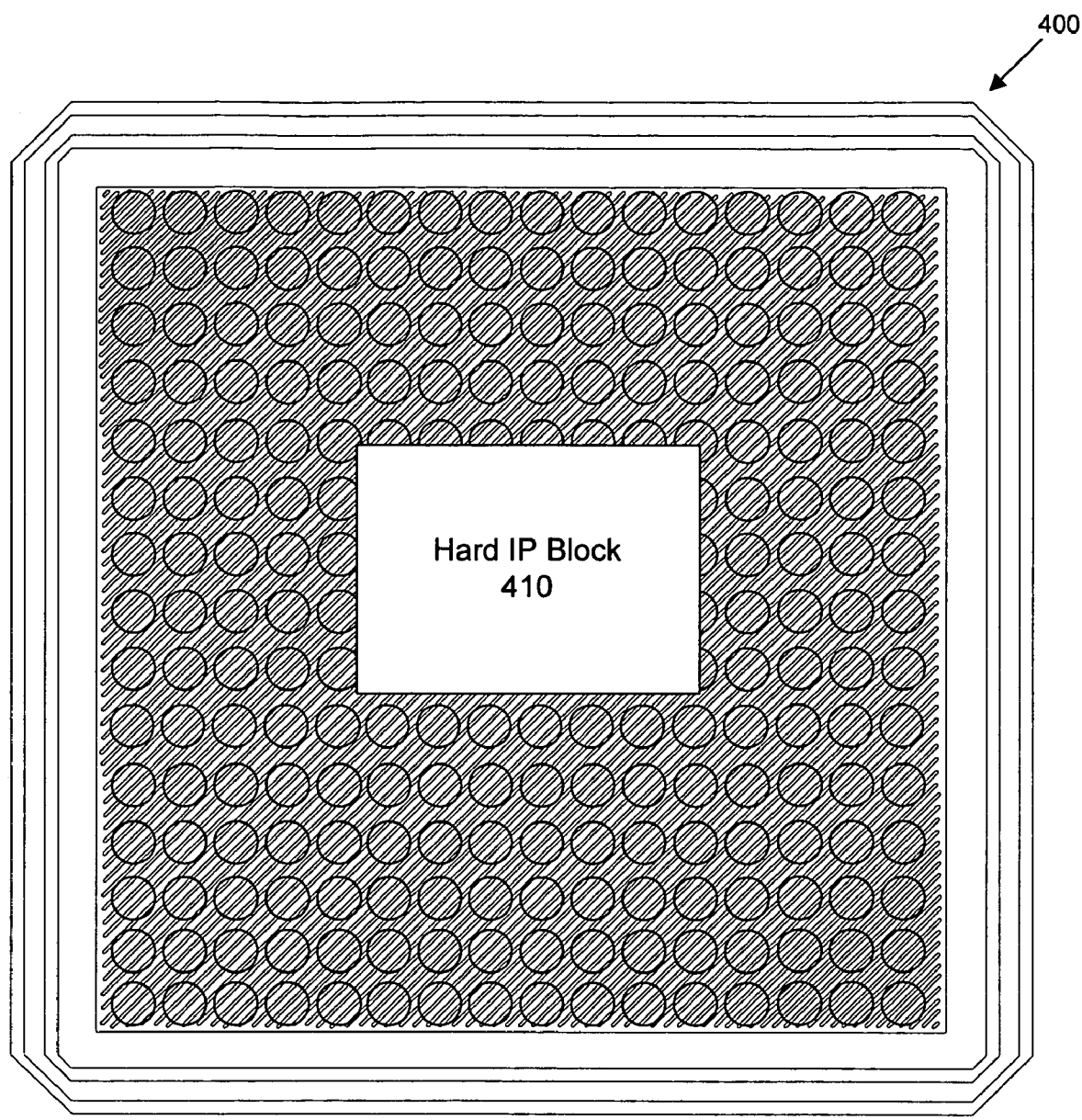
FIG. 4 illustrates a diagram of a power grid with a hard IP block according to an embodiment of the present invention.

FIG. 4 illustrates a further embodiment of the present invention. Integrated circuit 400 shown in FIG. 4 includes diagonal traces that are alternately coupled to $V_{DD}$ and $V_{SS}$ as discussed in the embodiments above. Integrated circuit 400 also includes a hard intellectual (IP) property block 410. Hard IP 410 can comprise any circuit design. Hard IP block 410 includes a portion of the power supply layer. Therefore, the $V_{DD}$ and $V_{SS}$ traces of the present invention do not overlay hard IP block 410. The $V_{DD}$ and $V_{SS}$ traces provide supply voltages to everywhere on chip 400 except to IP block 410.

The point of FIG. 4 is to show that the present invention can include a power supply layer with holes in it that are used by a hard IP block with connections made to the IP block from the power grid of the present invention. The present invention also includes integrated circuits where the power grid covers and connects to the hard IP block.

Figure 5:
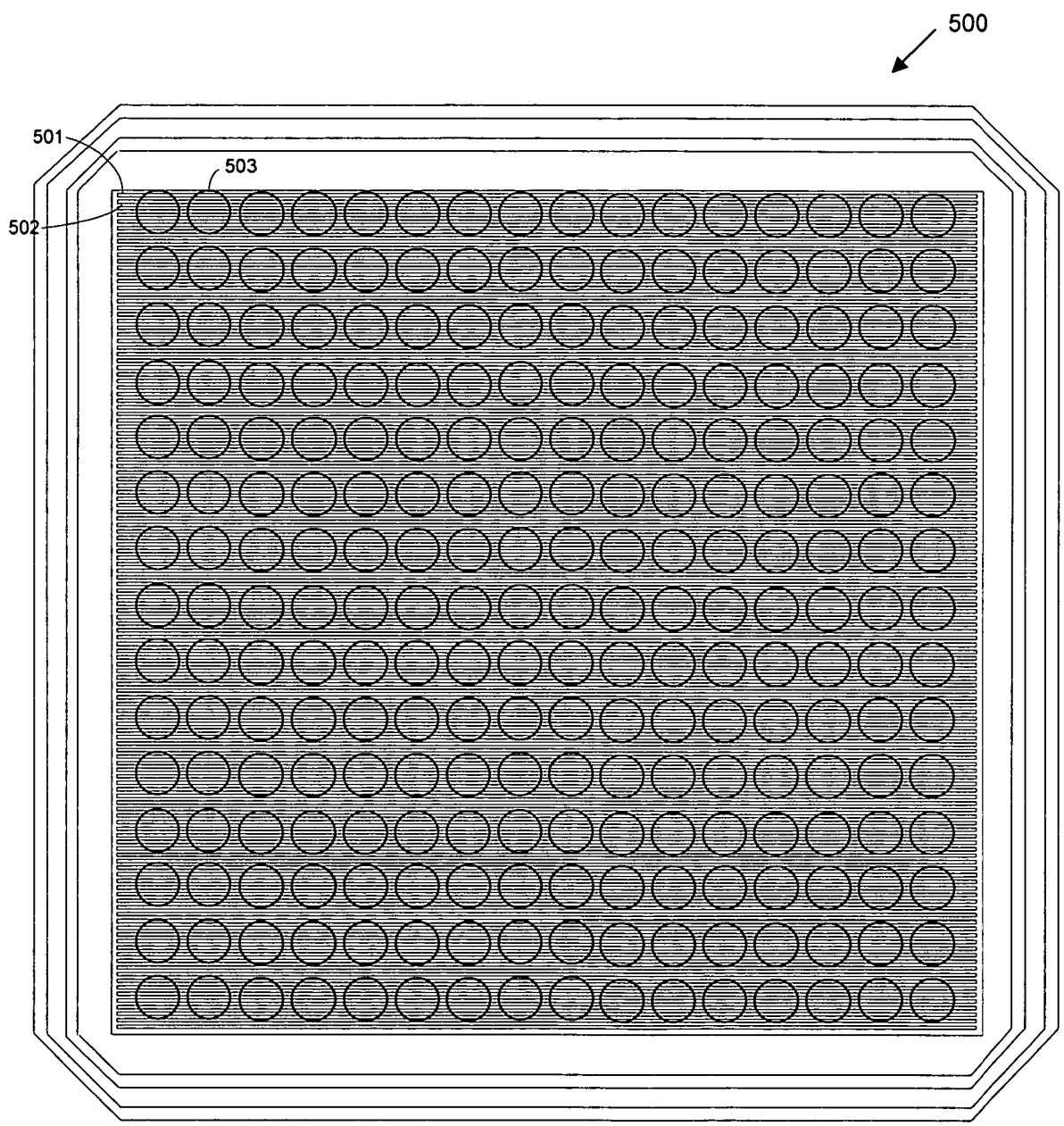
FIG. 5 illustrates a diagram of a power grid with horizontal power supply traces according to an embodiment of the present invention.

FIG. 5 illustrates yet another embodiment of the present invention. Integrated circuit 500 shown in FIG. 5 includes several horizontal $V_{DD}$ and $V_{SS}$ power supply traces such as traces 501 and 502. The horizontal $V_{DD}$ and $V_{SS}$ power supply traces of FIG. 5 are interleaved as with the previous embodiments. Thus, the horizontal traces of circuit 500 form an interleaved combed structure of $V_{DD}$ and $V_{SS}$ traces.

The horizontal power supply traces are formed in a conductive layer such as metal. Each of the horizontal traces is coupled to one or more solder bumps (such as solder bump 503) as with the embodiments described above.

Circuit elements in other layers of chip 500 can connect to the horizontal $V_{DD}$ and $V_{SS}$ traces. The connections to the $V_{DD}$ and $V_{SS}$ traces can be made at any point along the length of the traces. The connections can be made via a second conductive layer that is perpendicular to the $V_{DD}$ and $V_{SS}$ traces.

Circuit 500 provides a more uniform power supply voltage to circuit elements in other layers of the chip, because each of the $V_{DD}$ and $V_{SS}$ traces are the same length. Therefore, the voltage drop removed from the power supply by the $V_{DD}$ and $V_{SS}$ traces is about the same everywhere on circuit 500. The present invention also includes vertical power supply traces and connections.

The present invention provides techniques for routing power supply voltages into an integrated circuit along routing traces (conductors). The present invention reduces the voltage drop introduced by the routing wires into the supply voltage by providing interleaved traces across the circuit, as discussed above. Circuit elements that receive larger power supply voltages usually operate at faster speeds.

The present invention reduces the differential between supply voltages provided to the edge of a chip and supply voltages provided to the center of the chip. This reduces variations in the speed of circuit elements in different areas of a chip. It is especially important that more uniform power supply voltages be provided in large area chips, chips that consume a large amount of power, chips that have wires with finer geometries (i.e., larger routing resistances), and chips that have more congested routing layers.

While the present invention has been described herein with reference to particular embodiments thereof, a latitude of modification, various changes, and substitutions are intended in the present invention. In some instances, features of the invention can be employed without a corresponding use of other features, without departing from the scope of the invention as set forth. Therefore, many modifications may be made to adapt a particular configuration or method disclosed, without departing from the essential scope and spirit of the present invention. It is intended that the invention not be limited to the particular embodiment disclosed, but that the invention will include all embodiments and equivalents falling within the scope of the claims.

What is claimed is:

1. An integrated circuit comprising:
   first solder bumps coupled to receive a first power supply voltage;
   second solder bumps coupled to receive a second power supply voltage;

a first conductive layer having first traces electrically connected to the first solder bumps and having second traces electrically connected to the second solder bumps, wherein the first traces are interleaved between the second traces such that at least one of the first traces is located in between two of the second traces, and at least one of the second traces in located in between two of the first traces; and a second conductive layer comprising first conductive pads electrically connected to the first solder bumps and second conductive pads electrically connected to the second solder bumps;

the second conductive layer further including first conductive fingers electrically connected to the first conductive pads and extending outwardly from the first conductive pads and second conductive fingers electrically connected to the second conductive pads and extending outwardly from the second conductive pads;

first vias extending from the first conductive fingers to the first traces and second vias extending from the second conductive fingers to the second traces;

each. of the first conductive fingers and the second conductive fingers including four conductive fingers per conductive pad an the fingers are arranged such that two fingers extend outwardly in opposite directions along a first axis and two other fingers extend outwardly in opposite directions along a second axis; and wherein the second axis is substantially perpendicular to the first axis.

2. The integrated circuit of claim 1 wherein the first and the second traces are deposed in the first conductive layer diagonally with respect to orientation of the conductive fingers.

3. The integrated circuit of claim 2 further comprising additional electrically conductive regions disposed in the second conductive layer, the additional electrically conductive regions being electrically connected to circuit elements in the integrated circuit and to selected ones of the first traces and the second traces.

4. The integrated circuit of claim 1 wherein the integrated circuit includes a previously defined block of circuitry connected to receive electrical signals from the first traces and the second traces.

5. An integrated circuit comprising:

an array of solder bumps for being connected to external power supply and ground potential, the first solder bumps for receiving a power supply voltage and the second solder bumps for receiving a ground voltage;

a first conductive layer having interspersed traces with first traces electrically connected to the first solder bumps and second traces electrically connected to the second solder bumps, wherein the first traces are interleaved between the second traces such that substantially each first trace is located between two second traces, and substantially each second trace is located between two first traces; and a second conductive layer comprising first conductive pads electrically connected to the first solder bumps to receive the power supply voltage and second conductive pads electrically connected to the second solder bumps to receive the ground voltage;

the second conductive layer further including first conductive fingers electrically connected to, and extending outward from, at least some of the first conductive pads and second conductive fingers electrically connected to, and extending outwardly from at least some of the second conductive pads;

first vias extending from the first conductive fingers to the first traces and second vias extending from the conductive fingers associated with the second conductive pads to the second traces; and wherein substantially all of the first traces are connected to at least two of the first conductive fingers and substantially all of the second traces are connected to at least two of the second conductive fingers.

6. The integrated circuit defined in claim 5 further comprising additional conductors formed in the second conductive layer, the additional conductors being connected to one of the first traces and the second traces through vias.

7. The integrated circuit defined in claim 6 wherein circuit elements in the integrated circuit are coupled to receive the power supply voltage and the ground voltage through the additional conductors.

8. The integrated circuit defined in claim 6 wherein both the first traces and the second traces are disposed at about a 45degree angle with respect to an edge of the integrated circuit.

9. The integrated circuit of claim 5 wherein the integrated circuit includes a previously defined block of circuitry connected to the power supply voltage through the first traces and to the ground voltage through the second traces.

* * * * *